United States Patent
Cheng et al.

(10) Patent No.: US 11,023,701 B2
(45) Date of Patent: Jun. 1, 2021

(54) SIGNAL PROCESSING CIRCUIT AND RELATED METHOD OF PROCESSING SENSING SIGNAL

(71) Applicant: NOVATEK Microelectronics Corp., Hsin-Chu (TW)

(72) Inventors: Kuo-Wei Cheng, Hsinchu (TW); Min Huang, Taoyuan (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/425,887

(22) Filed: May 29, 2019

(65) Prior Publication Data

US 2020/0380231 A1 Dec. 3, 2020

(51) Int. Cl.
*G06K 9/00* (2006.01)
*H03K 17/96* (2006.01)

(52) U.S. Cl.
CPC ....... *G06K 9/0002* (2013.01); *H03K 17/9622* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,495,200 | A * | 2/1996 | Kwan | H03H 19/004 327/553 |
| 5,914,638 | A * | 6/1999 | He | G11C 27/026 327/96 |
| 9,184,712 | B2 * | 11/2015 | Song | H04L 27/01 |
| 9,621,178 | B2 * | 4/2017 | Graceffo | G06F 21/44 |
| 10,331,282 | B2 * | 6/2019 | Srivastava | G06F 3/0412 |
| 10,348,342 | B2 * | 7/2019 | Giraldo | H03M 1/0626 |

* cited by examiner

*Primary Examiner* — An T Luu
(74) *Attorney, Agent, or Firm* — Winston Hsu

(57) ABSTRACT

A signal processing circuit for processing a sensing signal from a sensing circuit includes a plurality of input capacitors, an amplifier, an input switch group, a plurality of storage capacitors and a plurality of storage control switches. The plurality of input capacitors are configured to receive the sensing signal from one of a differential input nodes of the signal processing circuit and couple the sensing signal to a plurality of floating nodes. The amplifier, coupled to the plurality of floating nodes, is configured to amplify the sensing signal coupled from the plurality of floating nodes. The input switch group is coupled between the plurality of floating nodes and the plurality of input capacitors. The plurality of storage control switches, coupled between the plurality of floating nodes and the plurality of storage capacitors, are configured to couple offset information of the plurality of input capacitors to the plurality of storage capacitors.

18 Claims, 8 Drawing Sheets

SIGNAL PROCESSING CIRCUIT AND RELATED METHOD OF PROCESSING SENSING SIGNAL

BACKGROUND OF THE INVENTION

1. Field of the Invention

The present invention relates to a signal processing circuit and a related method of processing a sensing signal, and more particularly, to a signal processing circuit and a related method of processing a sensing signal for a fingerprint sensor.

2. Description of the Prior Art

With advancements in technology, mobile devices such as smart phones, tablets, laptops, GPS navigation systems and electronic books have become indispensable in our daily life. Compared with conventional mobile phones that only have communication functions, modern mobile devices combine various functions such as communication, networking, photographing, games and data processing. This type of multifunctional design is more attractive to consumers. Fingerprint recognition is a popular function for security and privacy in various electronic devices including mobile devices, and can be implemented in different techniques such as capacitive sensing, optical (image sensing), thermal, ultrasonic, etc. For example, a mobile phone may have a fingerprint recognition interface built into a home button or in a dedicated region to detect user fingerprint.

Among those fingerprint recognition techniques, the capacitive fingerprint recognition scheme has become a popular way. With capacitive fingerprint recognition, the sensing pixels in a fingerprint sensor may fetch the capacitance of a touch finger. The capacitance is processed and converted into a voltage signal which is further forwarded to a follow-up circuit such as an analog front-end (AFE) circuit to be recognized. The voltage signals obtained from the sensing pixels usually include a common-mode (CM) part and a differential-mode (DM) part, wherein the DM part is a useful signal, and the CM part is a useless signal and should be removed in the AFE circuit.

The AFE circuit may apply compensation capacitors with a rising compensation signal to remove most of the unwanted CM part. However, due to process variations, there may be mismatch between the compensation capacitors and/or input capacitors, such that the CM part variation may not be entirely canceled. Thus, there is a need for improvement over the prior art.

SUMMARY OF THE INVENTION

It is therefore an objective of the present invention to provide a signal processing circuit and a related method of processing a sensing signal from a fingerprint sensor, to entirely remove the common-mode part of the sensing signal and cancel the influence of the offset generated from the capacitors in the signal processing circuit by swapping the switch configuration and storing the offset information.

An embodiment of the present invention discloses a signal processing circuit for processing a sensing signal from a sensing circuit. The signal processing circuit comprises a plurality of input capacitors, an amplifier, an input switch group, a plurality of storage capacitors and a plurality of first storage control switches. The plurality of input capacitors are configured to receive the sensing signal from one of a differential input nodes of the signal processing circuit and couple the sensing signal to a plurality of floating nodes. The amplifier, coupled to the plurality of floating nodes, is configured to amplify the sensing signal coupled from the plurality of floating nodes. The input switch group is coupled between the plurality of floating nodes and the plurality of input capacitors. The plurality of first storage control switches, coupled between the plurality of floating nodes and the plurality of storage capacitors, are configured to couple offset information of the plurality of input capacitors to the plurality of storage capacitors.

Another embodiment of the present invention discloses a method of processing a sensing signal received from a sensing circuit for a signal processing circuit. The signal processing circuit comprises a plurality of input capacitors, an input switch group, a plurality of storage control switches and a plurality of storage capacitors. The method comprises the steps of: receiving a reference voltage and coupling the reference voltage to a plurality of floating nodes via the input switch group in a first configuration; coupling first offset information of the plurality of input capacitors to the plurality of storage capacitors via the plurality of storage control switches and storing the first offset information in the plurality of storage capacitors when the input switch group is in the first configuration; receiving the sensing signal from the sensing circuit and coupling the sensing signal to the plurality of floating nodes via the input switch group in a second configuration; and amplifying the sensing signal coupled from the plurality of floating nodes and canceling the first offset information stored in the plurality of storage capacitors when the input switch group is in the second configuration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
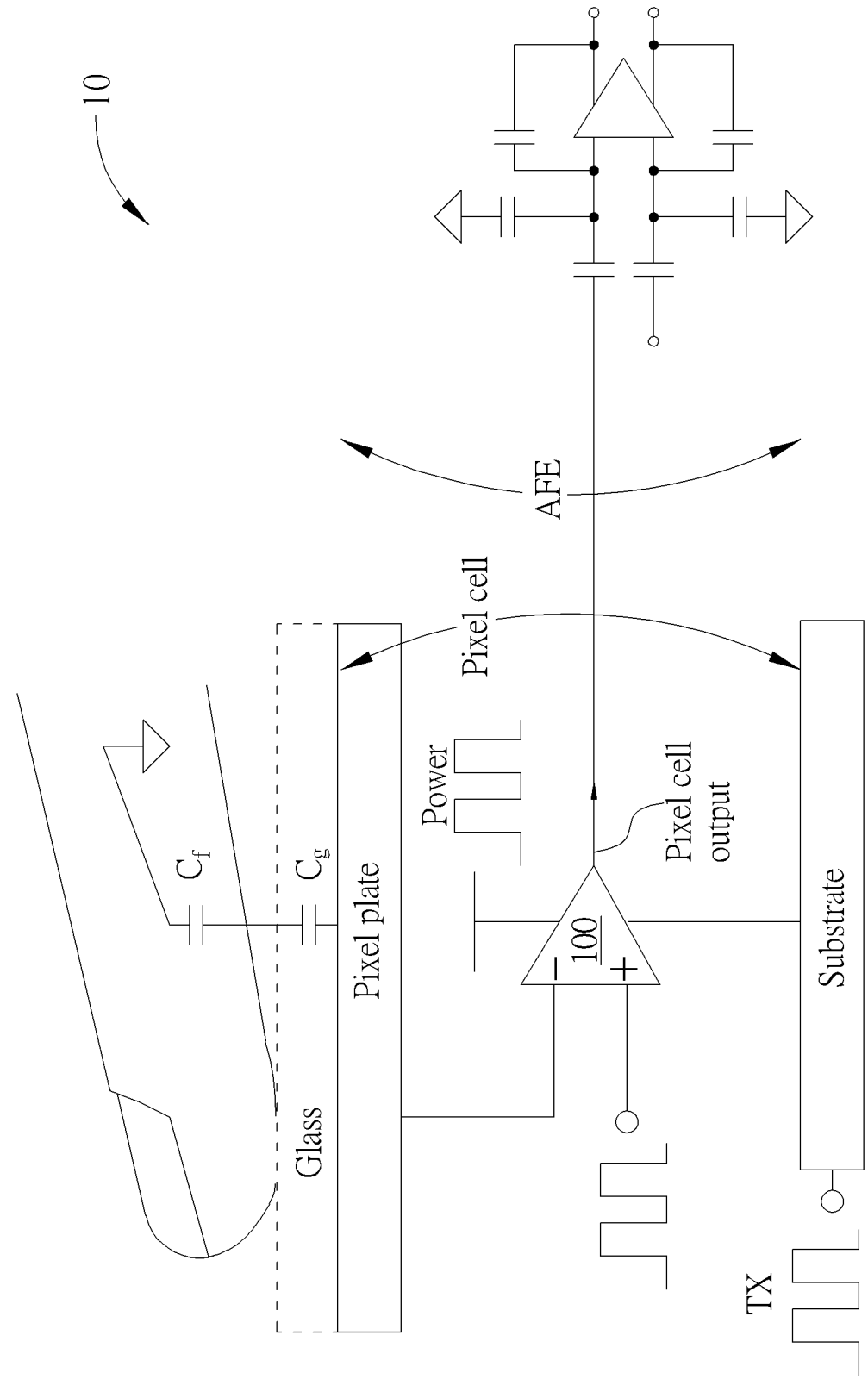
FIG. 1 is a schematic diagram of an exemplary fingerprint sensing circuit.

Please refer to FIG. 1, which is a schematic diagram of an exemplary fingerprint sensing circuit 10. The exemplary fingerprint sensing circuit 10 includes a pixel array and an analog front-end (AFE) circuit, where only one pixel cell in the pixel array is illustrated for simplicity. In the pixel array, each pixel cell includes a sensing electrode (as the pixel plate shown in FIG. 1) and a charge amplifier 100 (or called a pixel amplifier). Multiple pixel cells can be switched time-divisionally to output respective sensing signals to the AFE circuit. A finger touching the fingerprint sensor is considered as being connected to the universal ground. By using the transmitting signal TX (or called excitation signal), the pixel array may obtain information of a finger capacitance $C_f$ and convert the finger capacitance information into the sensing signal (which may be a voltage signal) as the output signal of the charge amplifier 100.

Figure 2:
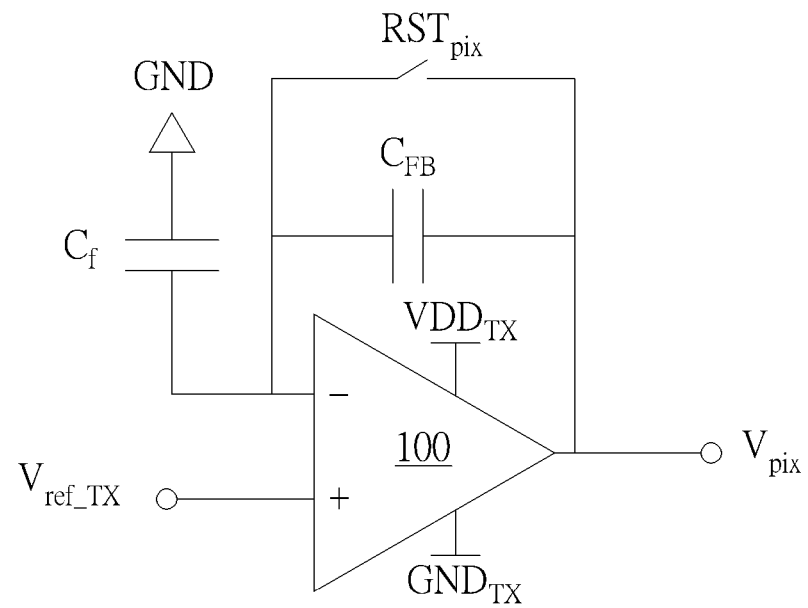
FIG. 2 is a schematic diagram of a detailed circuit structure of the pixel cell shown in FIG. 1.
Figure 2:
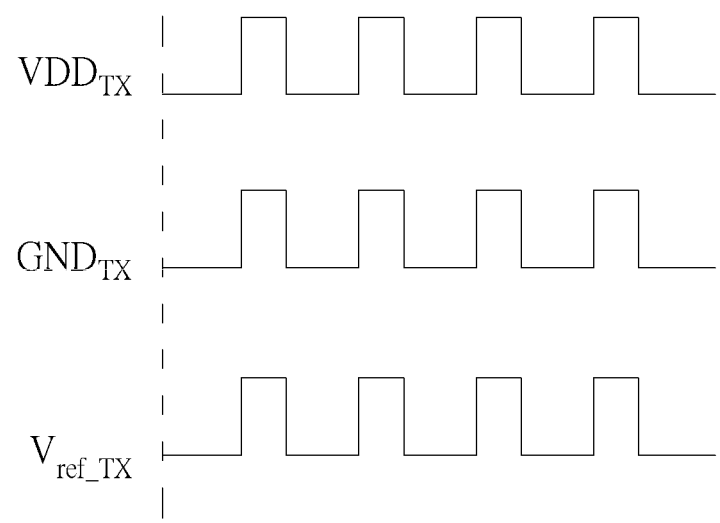

Please refer to FIG. 2, which is a schematic diagram of a detailed circuit structure of the pixel cell shown in FIG. 1. As shown in FIG. 2, the charge amplifier 100 of the pixel cell has a differential circuit structure, where the inverting input terminal of the charge amplifier 100 receives the signal that carries the information of the finger capacitance $C_f$ and the non-inverting input terminal of the charge amplifier 100 receives a reference voltage $V_{ref\_TX}$. As shown in FIG. 1, a transmitting signal TX such as a square wave signal is supplied to a substrate where the charge amplifier circuit is disposed, and voltage signals including the power supply voltage $VDD_{TX}$, the ground voltage $GND_{TX}$ and the reference voltage $V_{ref\_TX}$ have a shifted level based on the transmitting signal TX. In other words, these voltage signals toggle following the transmitting signal TX, and their voltage levels transit at the same time and the amplitudes of theses voltage signals are substantially equal to the amplitude of the transmission signal TX, $\Delta V_{CM}$. The transmitting signal TX may be generated by a charge pump circuit (not shown in FIG. 1) built in the fingerprint sensing circuit 10. In the pixel cell, a feedback capacitor $C_{FB}$ is coupled between the inverting input terminal of the charge amplifier 100 and the output terminal of the charge amplifier 100, and a reset switch $RST_{pix}$ is coupled between the inverting input terminal of the charge amplifier 100 and the output terminal of the charge amplifier 100.

Figure 3:
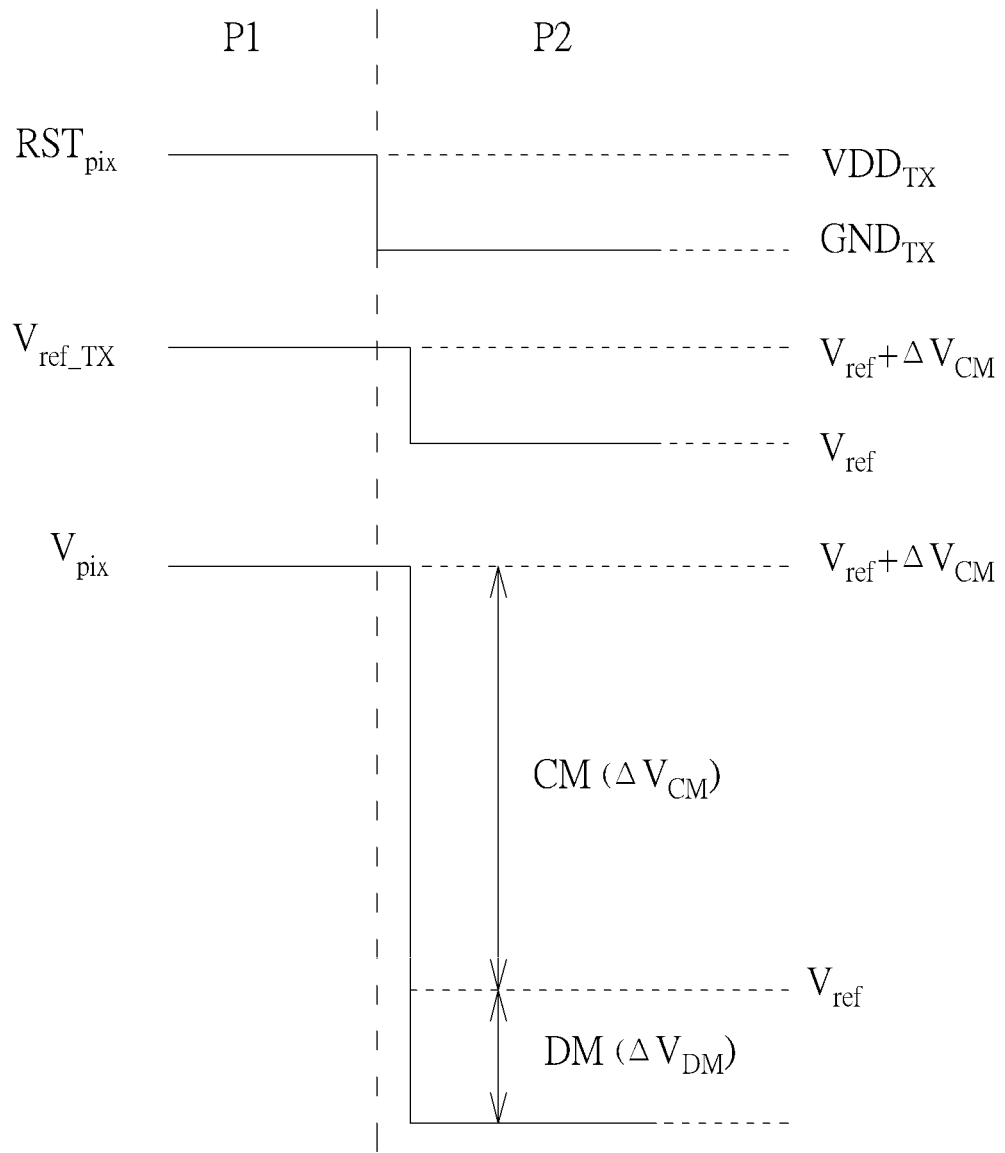
FIG. 3 illustrates an exemplary waveform of the sensing signal of the pixel cell and the reference voltage and the status of the reset switch.

The output terminal of the pixel cell (i.e., the output terminal of the charge amplifier 100) is connected to an input node of the AFE circuit. The sensing signal $V_{pix}$ of the pixel cell is outputted to the AFE circuit. FIG. 3 illustrates an exemplary waveform of the sensing signal $V_{pix}$ of the pixel cell and related signals such as the reference voltage $V_{ref\_TX}$ and the status of the reset switch $RST_{pix}$. The switch status "High" refers to turned-on and "Low" refers to turned-off. As shown in FIG. 3, in the period P1, the reset switch $RST_{pix}$ is turned on (closed), and thus the output terminal of the charge amplifier 100 is connected to the inverting input terminal of the charge amplifier 100; hence, the output sensing signal $V_{pix}$ is equal to the reference voltage $V_{ref\_TX}$, which has the voltage value $V_{ref}$ (e.g., 1V) plus $\Delta V_{CM}$ (e.g., 3V, which is the amplitude of the transmitting signal TX). In the period P2, the reset switch $RST_{pix}$ is turned off (open), and the charge amplifier 100 carries out the information of the finger capacitance $C_f$ in the sensing signal $V_{pix}$. At this moment, the transmitting signal TX transits from "High" to "Low", and the reference voltage $V_{ref\_TX}$ correspondingly transits its level from $V_{ref}+\Delta V_{CM}$ to $V_{ref}$ following the falling edge of the transmitting signal TX; hence, the sensing signal $V_{pix}$ of the pixel cell correspondingly falls. The downward level of the sensing signal $V_{pix}$ includes a common-mode (CM) part and a differential-mode (DM) part. The CM part is substantially equal to the amplitude of the transmitting signal TX, $\Delta V_{CM}$. The DM part $\Delta V_{DM}$, which includes the information of the finger capacitance $C_f$, may be obtained as follows:

$$\Delta V_{DM} = \frac{C_f}{C_{FB}} \Delta V_{CM}.$$

In general, since the finger capacitance $C_f$ is a weak signal, the DM part signal (with respect to the finger capacitance $C_f$) is quite weaker than the CM part signal. Every time when the reset switch $RST_{pix}$ is turned off and the level of the transmitting signal TX transits from "High" to "Low", the sensing signal $V_{pix}$ at the output terminal of the pixel cell may appear to have the waveform as shown in FIG. 3. If there is no touch finger sensed, only the CM part signal appears in the sensing signal $V_{pix}$. If a finger contacts the sensor and the transmitting signal TX transits from "High" to "Low", both the CM part signal and the DM part signal appear in the sensing signal $V_{pix}$, as shown in FIG. 3.

The sensing signal $V_{pix}$ outputted from the pixel cell is then received by the AFE circuit. Note that the toggle of the transmitting signal TX may generate a large voltage variation such as the CM part in the sensing signal $V_{pix}$. In order to cancel the large variation of the CM part signal and maintain the input voltage of the differential amplifier in the AFE circuit at a constant level, differential compensation capacitors together with differential input capacitors are disposed at the input nodes of the AFE circuit. However, due to process variations, there may be mismatch between capacitance values of the compensation capacitors and/or the input capacitors, and the mismatch degree is determined by the capacitance values and the layout structure. This mismatch causes that the variation of the CM part cannot be entirely canceled. The remaining CM part signal may be amplified by the differential amplifier in the AFE circuit, to influence the voltage swing at the output nodes of the AFE circuit. That is, the output signal of the AFE circuit may include the amplified CM component that is not canceled, such that the efficiency of an analog to digital converter (ADC) following the AFE circuit may be degraded since parts of the capacity of the ADC should be allocated to process the CM component.

Figure 4:
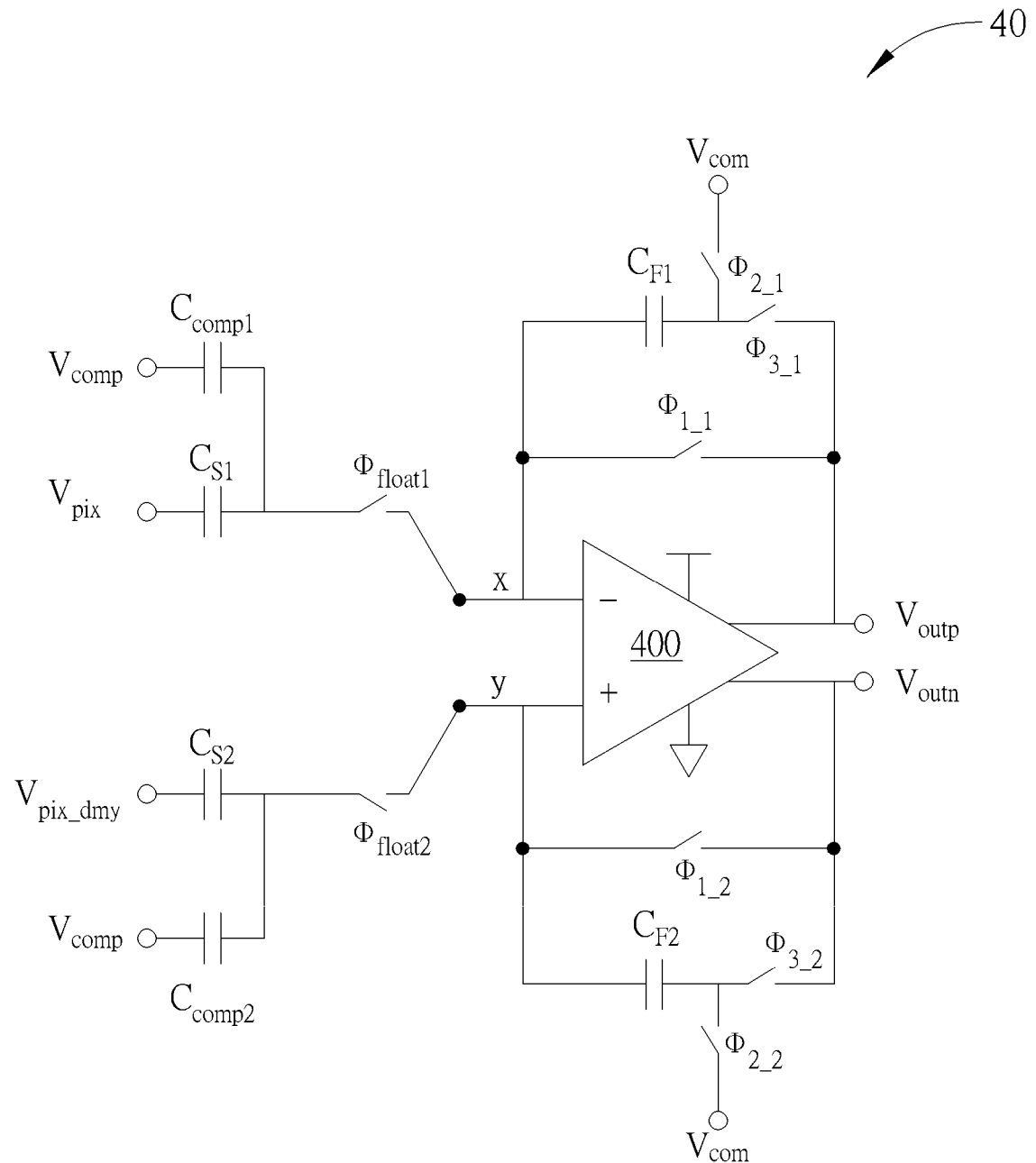
FIG. 4 is a schematic diagram of an analog front-end (AFE) circuit.

Please refer to FIG. 4, which is a schematic diagram of an AFE circuit 40. The AFE circuit 40 includes a pair of input capacitors $C_{S1}$ and $C_{S2}$, a pair of compensation capacitors $C_{comp1}$ and $C_{comp2}$, an amplifier 400, floating switches $\Phi_{float1}$ and $\Phi_{float2}$, storage capacitors $C_{F1}$ and $C_{F2}$, reset switches $\Phi_{1\_1}$ and $\Phi_{1\_2}$, and storage control switches $\Phi_{2\_1}$, $\Phi_{2\_2}$, $\Phi_{3\_1}$ and $\Phi_{3\_2}$. The differential input terminals of the amplifier 400 are coupled to floating nodes x and y, respectively. The floating switches $\Phi_{float1}$ and $\Phi_{float2}$ are coupled between the input capacitor $C_{S1}$ and the floating node x and between the input capacitor $C_{S2}$ and the floating node y, respectively. The input capacitors $C_{S1}$ and $C_{S2}$ are further coupled to the differential input nodes of the AFE circuit 40, respectively. The floating switches $\Phi_{float1}$ and $\Phi_{float2}$ are further coupled to the compensation capacitors $C_{comp1}$ and $C_{comp2}$, respectively. The input capacitors $C_{S1}$ and $C_{S2}$ are configured to receive a sensing signal from a pixel cell via one of the differential input nodes of the AFE circuit 40. The received sensing signal may be a sensing signal generated from a fingerprint sensor and outputted by a pixel cell as shown in FIG. 2 (i.e., the sensing signal $V_{pix}$). Another input node receives a dummy signal $V_{pix\_dmy}$. If an input node of the AFE circuit 40 is coupled to the pixel cell for receiving the sensing signal $V_{pix}$, another input node of the AFE circuit 40 may be coupled to a dummy pixel cell for receiving the dummy signal $V_{pix\_dmy}$. The dummy pixel cell may have a circuit structure similar to the pixel cell shown in FIG. 2, and the dummy pixel cell is also toggled by the same transmitting signal TX, except that the inverting input terminal of the charge amplifier in the dummy pixel cell does not receive the information of finger capacitance $C_f$. In such a situation, the dummy signal $V_{pix\_dmy}$ may have a voltage swing and amplitude identical to the transmitting signal TX. Since both input nodes of the AFE circuit 40 receive signals based on the same transmitting signal TX, the noises from the transmitting signal TX may be canceled.

In addition, the compensation capacitors $C_{comp1}$ and $C_{comp2}$ are configured to receive a compensation signal $V_{comp}$, which may be arranged to have a variation direction opposite to the variation direction of the CM part of the sensing signal $V_{pix}$ and have an absolute amount of variation substantially equal to the absolute amount of variation of the CM part of the sensing signal $V_{pix}$. Therefore, the CM part of the sensing signal $V_{pix}$ and the compensation signal $V_{comp}$ may be canceled and only the desired DM part is coupled to the amplifier 400 to be amplified.

Please keep referring to FIG. 4. The reset switches $\Phi_{1\_1}$ and $\Phi_{1\_2}$ are coupled between the floating nodes x and y and the differential output terminals of the amplifier 400, respectively. The floating nodes x and y are further coupled to the storage capacitors $C_{F1}$ and $C_{F2}$, which are further coupled to the storage control switches $\Phi_{2\_1}$ and $\Phi_{3\_1}$ and the storage control switches $\Phi_{2\_2}$ and $\Phi_{3\_2}$, respectively. The storage control switches $\Phi_{2\_1}$ and $\Phi_{2\_2}$ are further coupled to a reference node for receiving a CM voltage $V_{com}$ as a reference, and the storage control switches $\Phi_{3\_1}$ and $\Phi_{3\_2}$ are further coupled to the differential output terminals of the amplifier 400 (i.e., the output nodes of the AFE circuit 40). With well configurations and controls of the storage control switches $\Phi_{2\_1}$, $\Phi_{2\_2}$, $\Phi_{3\_1}$ and $\Phi_{3\_2}$, auto-zeroing offset cancelation may be provided to cancel the input offset of the differential amplifier 400.

Figure 5:
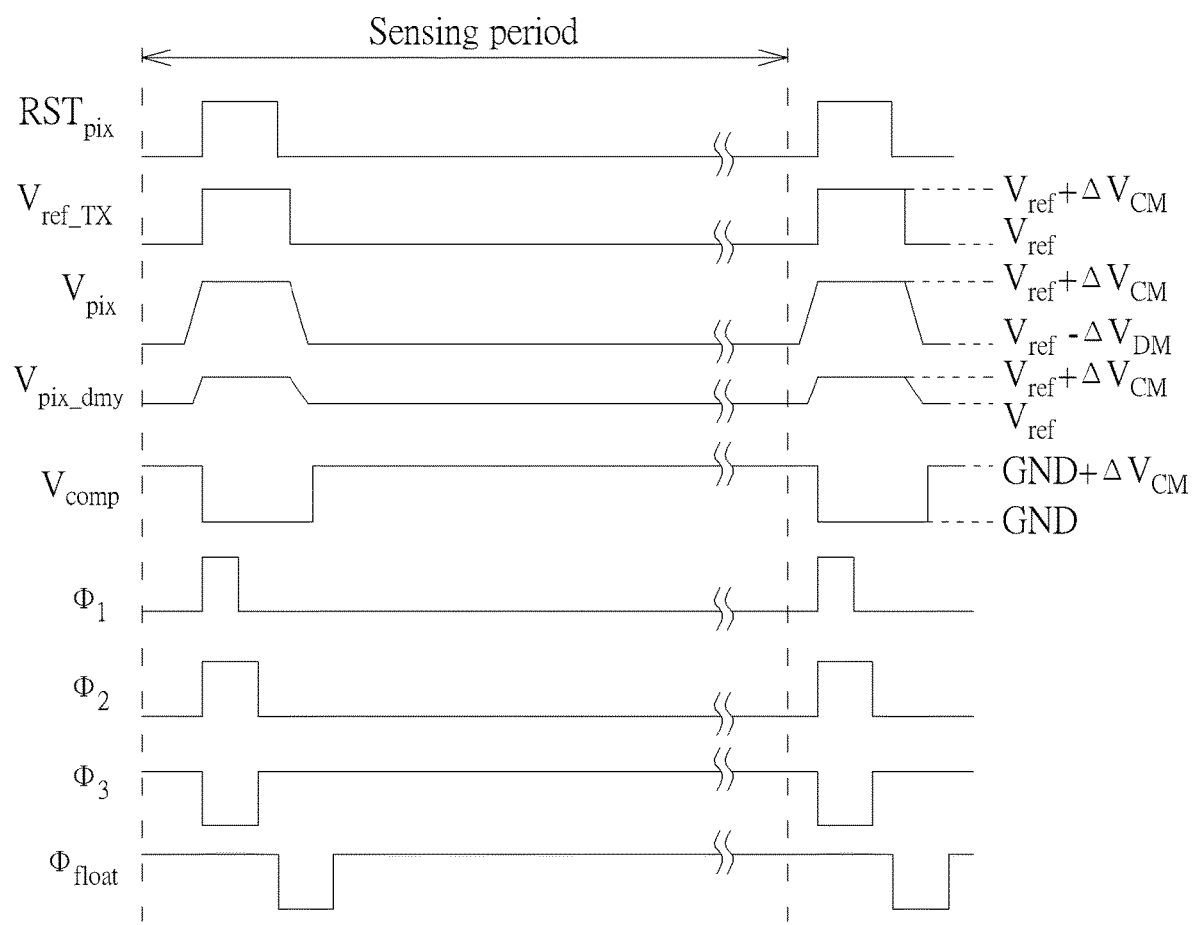
FIG. 5 is a waveform diagram of signals of the AFE circuit shown in FIG. 4.

Please refer to FIG. 5, which is a waveform diagram of signals of the AFE circuit 40. FIG. 5 illustrates the waveforms of the sensing signal $V_{pix}$, the dummy signal $V_{pix\_dmy}$ and the compensation signal $V_{comp}$. The statuses of the switches in the AFE circuit 40, the status of the reset switch $RST_{pix}$ in the corresponding pixel cell, and the waveform of the reference voltage $V_{ref\_TX}$ of the pixel cell are also illustrated in FIG. 5. Note that $\Phi_1$ denotes the status of the reset switches $\Phi_{1\_1}$ and $\Phi_{1\_2}$, $\Phi_2$ denotes the status of the storage control switches $\Phi_{2\_1}$ and $\Phi_{2\_2}$, $\Phi_3$ denotes the status of the storage control switches $\Phi_{3\_1}$ and $\Phi_{3\_2}$, and $\Phi_{float}$ denotes the status of the floating switches $\Phi_{float1}$ and $\Phi_{float2}$. In other words, $\Phi_1$, $\Phi_2$, $\Phi_3$ and $\Phi_{float}$ may be considered as waveforms of control signals for the corresponding switches. In this embodiment, the switch status (or waveform) "High" refers to turned-on and "Low" refers to turned-off.

As shown in FIG. 5, in each sensing period, the AFE circuit 40 and the corresponding pixel cell cooperate to output the voltage signal corresponding to the finger capacitance sensed by the pixel cell. In the pixel cell, the reset switch $RST_{pix}$ is turned off and then the reference voltage $V_{ref\_TX}$ transits from "High" ($V_{ref}+\Delta V_{CM}$) to "Low" ($V_{ref}$) following the transmitting signal TX. At the same time, the sensing signal $V_{pix}$ outputted by the pixel cell also transits from "High" ($V_{ref}+\Delta V_{CM}$) to "Low" ($V_{ref}-\Delta V_{DM}$) with an amplitude equal to the CM part ($\Delta V_{CM}$) corresponding to the transmitting signal TX plus the DM part ($\Delta V_{DM}$) corresponding to the finger capacitance information, and the dummy signal $V_{pix\_dmy}$ also transits from "High" ($V_{ref}+\Delta V_{CM}$) to "Low" ($V_{ref}$) with an amplitude equal to the CM part ($\Delta V_{CM}$) corresponding to the transmitting signal TX without carrying information of the finger capacitance (as the smaller amplitude of the dummy signal $V_{pix\_dmy}$ shown in FIG. 5). The CM part received by both input nodes of the AFE circuit 40 can thereby be canceled. Furthermore, the compensation signal $V_{comp}$ transits from "Low" (e.g., the ground voltage GND) to "High" (GND+$\Delta V_{CM}$) with an amplitude equal to the amplitude of the CM part ($\Delta V_{CM}$) of the sensing signal $V_{pix}$, so as to cancel the signal variation and prevent the large CM part variation to be coupled to the input terminals of the amplifier 400.

During the above transitions of the sensing signal $V_{pix}$, the dummy signal $V_{pix\_dmy}$ and the compensation signal $V_{comp}$, the floating switches $\Phi_{float1}$ and $\Phi_{float2}$ are turned off, so as to prevent the signal transitions from being coupled to the floating nodes x and y. This maintains the input terminals of the amplifier 400 at a constant voltage level.

Before the AFE circuit 40 starts to receive the DM part signal at the falling edge of the sensing signal $V_{pix}$, the amplifier 400 may be reset by turning on the reset switches $\Phi_{1\_1}$ and $\Phi_{1\_2}$ (as the turned-on pulse of $\Phi_1$ shown in FIG. 5). The reset operation allows each node in the amplifier 400 to be reset to a predetermined voltage level. Also, before the falling edge of the sensing signal $V_{pix}$, the storage control switches $\Phi_{2\_1}$, $\Phi_{2\_2}$, $\Phi_{3\_1}$ and $\Phi_{3\_2}$ toggle to control the storage capacitors $C_{F1}$ and $C_{F2}$ to be coupled to the reference node (receiving the CM voltage $V_{com}$) and then coupled to the output terminals of the amplifier 400. This operation provides auto-zeroing offset cancelation to cancel the input offset of the differential amplifier 400.

Subsequently, the floating switches $\Phi_{float1}$ and $\Phi_{float2}$ may be turned on after the CM part of the sensing signal $V_{pix}$ is compensated by the compensation signal $V_{comp}$. At this moment, the DM part signal $\Delta V_{DM}$ may be received and amplified by the amplifier 400, to be sent to the follow-up circuit such as the ADC. The remaining time in the sensing period shown in FIG. 5 refers to the operation time of the follow-up circuit. For example, the ADC requires a processing time for converting the analog voltage signal into digital data. However, due to the mismatch between the compensation capacitors $C_{comp1}$ and $C_{comp2}$ and/or the input capacitors $C_{S1}$ and $C_{S2}$ generated from process variations, the CM part variation of the sensing signal $V_{pix}$ may not be entirely canceled in the AFE circuit 40. The analysis related to the influence of mismatch on the output signal of the AFE circuit 40 is shown below.

Before the DM part signal $\Delta V_{DM}$ is outputted to the AFE circuit 40, both the sensing signal $V_{pix}$ and the dummy signal $V_{pix\_dmy}$ are at the "High" level (i.e., $V_{pix}=V_{ref}+\Delta V_{CM}$ and $V_{pix\_dmy}=V_{ref}+\Delta V_{CM}$). At this moment, the total charges on the floating nodes x and y may be obtained as follows:

$$q_{1,x}=(V_{com}+V_{os}+V_{ref}-\Delta V_{CM})C_{S1}+(V_{com}+V_{os})C_{comp1}+(V_{com}+V_{os}-V_{com})C_{F1};$$

$$q_{1,y}=(V_{com}-V_{ref}-\Delta V_{CM})C_{S2}+(V_{com})C_{comp2}+(V_{com}-V_{com})C_{F2};$$

wherein $V_{com}$ is the input CM voltage of the amplifier 400, and $V_{os}$ is the input offset voltage of the amplifier 400.

After the sensing signal $V_{pix}$ and the dummy signal $V_{pix\_dmy}$ transit from "High" to "Low", the DM part signal is carried out in the sensing signal $V_{pix}$. At this moment, the total charges on the floating nodes x and y may be obtained as follows:

$$q_{2,x} = (V'_{com} + V_{os} - V_{ref} + \Delta V_{DM})C_{S1} +$$

$$(V'_{com} + V_{os} - \Delta V_{CM})C_{comp1} + \left(V'_{com} + V_{os} - V_{com} + \frac{\Delta vo}{2}\right)C_{F1};$$

$$q_{2,y} = (V'_{com} - V_{ref})C_{S2} + (V'_{com} - \Delta V_{CM})C_{comp2} + \left(V'_{com} - V_{com} - \frac{\Delta vo}{2}\right)C_{F2}.$$

Wherein, $V_{com}'$ is the input CM voltage of the amplifier 400 after the variations of the sensing signal $V_{pix}$ and the dummy signal $V_{pix\_dmy}$ are coupled to the input terminals of the amplifier 400. Coupling of these signals may generate a small change on the input CM voltage (from $V_{com}$ to $V_{com}'$), and the change is small such that the level of $V_{com}'$ may be substantially equal to $V_{com}$. $\Delta vo$ is the differential output signal of the amplifier 400, and it is noted that:

$$V_{outp} = V_{com} + \frac{\Delta vo}{2};$$

$$V_{outn} = V_{com} - \frac{\Delta vo}{2}.$$

Due to charge conservation on the floating nodes x and y, the equations are obtained as:

$$q_{1,x} = q_{2,x};$$

$$q_{1,y} = q_{2,y}.$$

Taking $V_{com}' = V_{com}$, the above equations may be combined to obtain:

$$\frac{\{\Delta V_{CM}[(C_{comp1} - C_{comp2}) - (C_{S1} - C_{S2})] - \Delta V_{DM}C_{S1}\} \times 2}{(C_{F1} + C_{F2})} = \Delta vo. \quad (1)$$

As shown in Equation (1), the mismatch or offset of the input capacitors $C_{S1}$ and $C_{S2}$ and the compensation capacitors $C_{comp1}$ and $C_{comp2}$ is multiplied by the amplitude of the CM part signal $\Delta V_{CM}$, to be reflected in the output signal $\Delta vo$. In order to increase the magnitude of DM part signal $\Delta V_{DM}$ in the sensing signal $V_{pix}$, the CM part signal $\Delta V_{CM}$ may also be increased proportionally, which correspondingly increases the magnitude of the capacitors' offset. This severely limits the effective swing of the output signal $\Delta vo$, and the gain provided for the output signal $\Delta vo$ in follow-up stages may be limited.

In order to solve this problem, a swap scheme together with an additional offset sensing phase may be applied to store the offset information of the storage capacitors $C_{F1}$ and $C_{F2}$. The offset information can thereby be compensated or canceled during the signal coupling phase, which prevents the offset component from being generated in the output signal of the AFE circuit.

Figure 6:
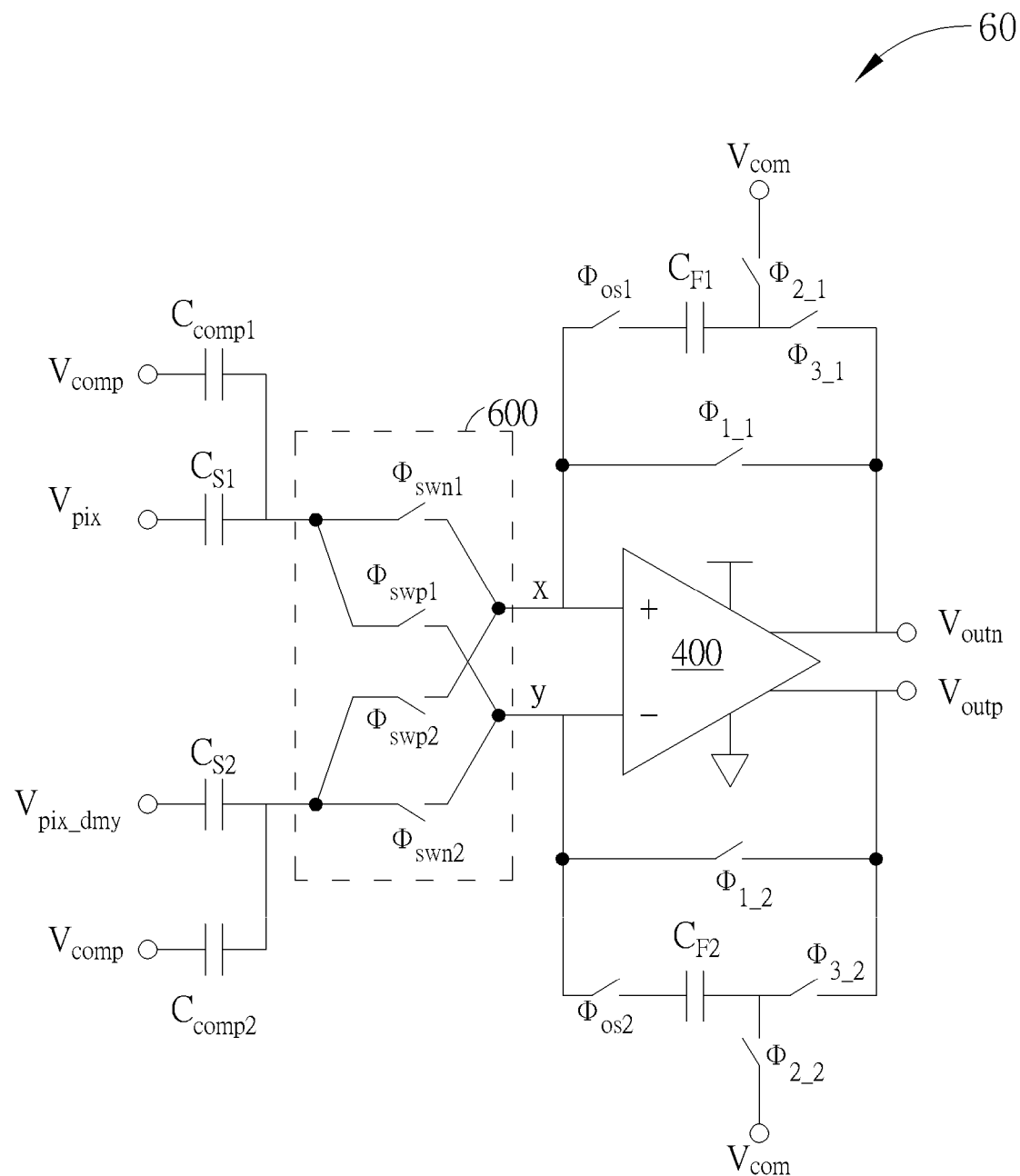
FIG. 6 is a schematic diagram of an AFE circuit according to an embodiment of the present invention.

Please refer to FIG. 6, which is a schematic diagram of an AFE circuit 60 according to an embodiment of the present invention. As shown in FIG. 6, the circuit structure of the AFE circuit 60 is similar to the circuit structure of the AFE circuit 40, so elements and signals having similar functions are denoted by the same symbols. The difference between the AFE circuit 60 and the AFE circuit 40 is that, in the AFE circuit 60, an input switch group 600 is included to replace the floating switches $\Phi_{float1}$ and $\Phi_{float2}$ in the AFE circuit 40. The input switch group 600 is coupled between the floating nodes x and y and the input capacitors $C_{S1}$ and $C_{S2}$. In addition, the AFE circuit 60 further includes two storage control switches $\Phi_{os1}$ and $\Phi_{os2}$, which are coupled between the floating nodes x and y and the storage capacitors $C_{F1}$ and $C_{F2}$, respectively. More specifically, the storage control switch $\Phi_{os1}$ is coupled between the floating node x and the storage capacitors $C_{F1}$, and the storage control switch $\Phi_{os2}$ is coupled between the floating node y and the storage capacitors $C_{F2}$. The storage control switches $\Phi_{os1}$ and $\Phi_{os2}$ are configured to couple the offset information of the input capacitors $C_{S1}$ and $C_{S2}$ and the offset information of the compensation capacitors $C_{comp1}$ and $C_{comp2}$ to the storage capacitors $C_{F1}$ and $C_{F2}$.

The input switch group 600 provides swapping of signal paths in the AFE circuit 60. In detail, the input switch group 600 may operate in a non-swapping configuration and a swapping configuration alternately, to provide different connection manners of signal paths. In the non-swapping configuration, the input switch group 600 couples the input capacitor $C_{S1}$ to the floating node x and couples the input capacitor $C_{S2}$ to the floating node y. In the swapping configuration, the input switch group 600 couples the input capacitor $C_{S1}$ to the floating node y and couples the input capacitor $C_{S2}$ to the floating node x.

In an embodiment, the input switch group 600 includes 4 input switches $\Phi_{swn1}$, $\Phi_{swn2}$, $\Phi_{swp1}$ and $\Phi_{swp2}$, as shown in FIG. 6. In detail, the input switch $\Phi_{swn1}$ is coupled between the input capacitor $C_{S1}$ and the floating node x, the input switch $\Phi_{swn2}$ is coupled between the input capacitor $C_{S2}$ and the floating node y, the input switch $\Phi_{swp1}$ is coupled between the input capacitor $C_{S1}$ and the floating node y, and the input switch $\Phi_{swp2}$ is coupled between the input capacitor $C_{S2}$ and the floating node x. These switches are controlled to be turned on or off to realize the non-swapping configuration and the swapping configuration. In detail, in the non-swapping configuration, the input switches $\Phi_{swn1}$ and $\Phi_{swn2}$ are turned on and the input switches $\Phi_{swp1}$ and $\Phi_{swp2}$ are turned off, and in the swapping configuration, the input switches $\Phi_{swp1}$ and $\Phi_{swp2}$ are turned on and the input switches $\Phi_{swn1}$ and $\Phi_{swn2}$ are turned off.

Please keep referring to FIG. 6. The storage control switches $\Phi_{os1}$ is coupled between the floating node x and a terminal of the storage capacitor $C_{F1}$, and another terminal of the storage capacitor $C_{F1}$ is further coupled to other storage control switches $\Phi_{2\_1}$ and $\Phi_{3\_1}$. The storage control switch $\Phi_{2\_1}$ is coupled between the storage capacitor $C_{F1}$ and a reference node, allowing the storage capacitor $C_{F1}$ to receive the CM voltage $V_{com}$ as a reference. The storage control switch $\Phi_{3\_1}$ is coupled between the storage capacitor $C_{F1}$ and an output terminal of the amplifier 400, allowing the DM part of the sensing signal $V_{pix}$ to be coupled to the output terminal of the amplifier 400 and appear in the output signal $\Delta vo$. The storage control switches $\Phi_{os2}$ is coupled between the floating node y and a terminal of the storage capacitor $C_{F2}$, and another terminal of the storage capacitor $C_{F2}$ is further coupled to other storage control switches $\Phi_{2\_2}$ and $\Phi_{3\_2}$. The storage control switch $\Phi_{2\_2}$ is coupled between the storage capacitor $C_{F2}$ and a reference node, allowing the storage capacitor $C_{F2}$ to receive the CM voltage $V_{com}$ as a reference. The storage control switch $\Phi_{3\_2}$ is coupled between the storage capacitor $C_{F2}$ and another output terminal of the amplifier 400. Similar to those switches in the AFE circuit 40, the storage control switches $\Phi_{2\_1}$, $\Phi_{2\_2}$, $\Phi_{3\_1}$ and $\Phi_{3\_2}$ in the AFE circuit 60 aim at providing auto-zeroing offset cancelation function.

Figure 7:
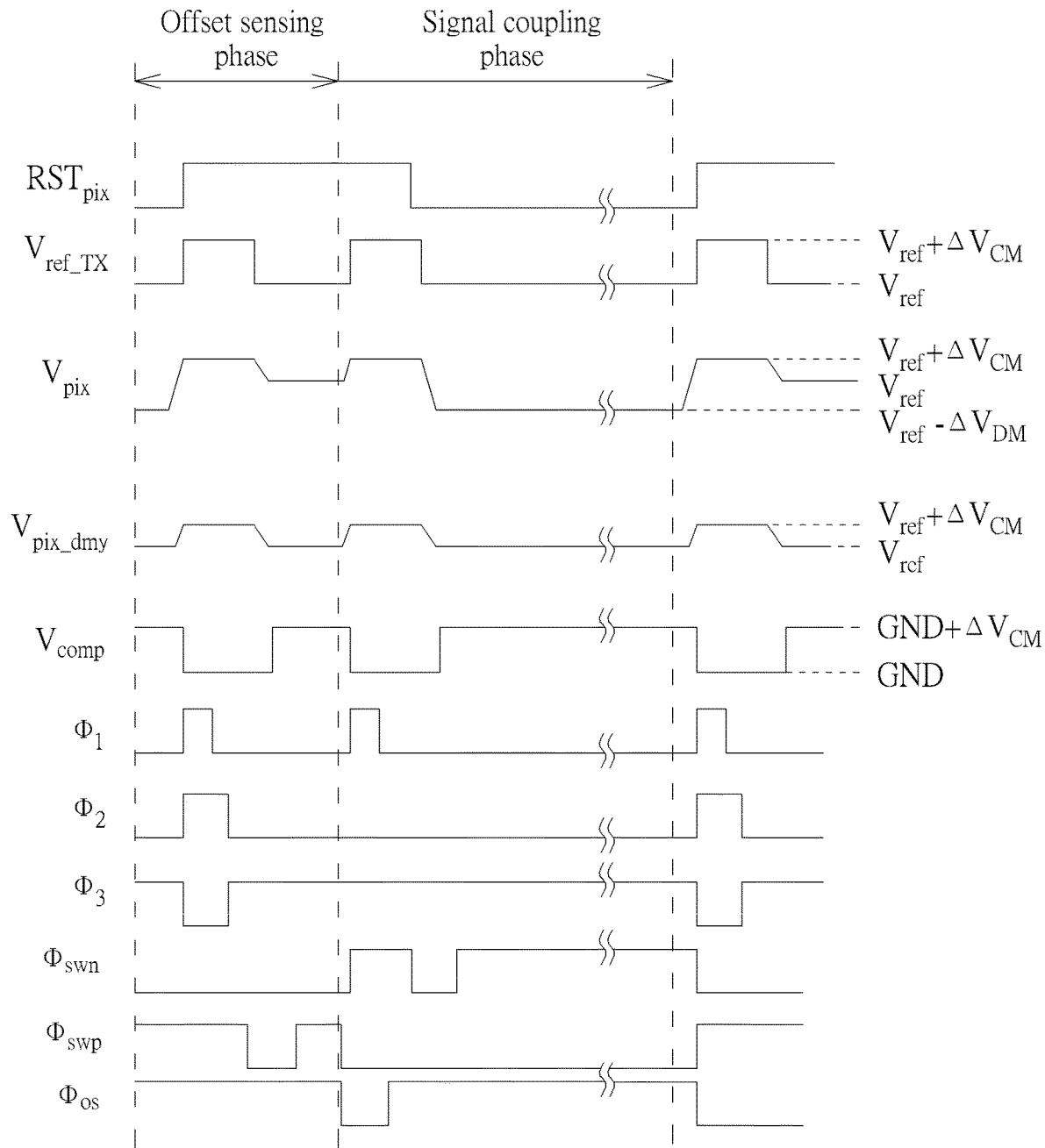
FIG. 7 is a waveform diagram of signals of the AFE circuit shown in FIG. 6.

Please refer to FIG. 7, which is a waveform diagram of signals of the AFE circuit 60. FIG. 7 illustrates the waveforms of the sensing signal $V_{pix}$, the dummy signal $V_{pix\_dmy}$ and the compensation signal $V_{comp}$. The statuses of the switches in the AFE circuit 60, the status of the reset switch $RST_{pix}$ in the corresponding pixel cell, and the waveform of the reference voltage $V_{ref\_TX}$ of the pixel cell are also illustrated in FIG. 7. Note that $\Phi_1$ denotes the status of the reset switches $\Phi_{1\_1}$ and $\Phi_{1\_2}$, $\Phi_2$ denotes the status of the storage control switches $\Phi_{2\_1}$ and $\Phi_{2\_2}$, $\Phi_3$ denotes the status of the storage control switches $\Phi_{3\_1}$ and $\Phi_{3\_2}$, $\Phi_{swp}$ denotes the status of the input switches $\Phi_{swp1}$ and $\Phi_{swp2}$, $\Phi_{swn}$ denotes the status of the input switches $\Phi_{swn1}$ and $\Phi_{swn2}$, and $\Phi_{os}$ denotes the status of the storage control switches $\Phi_{os1}$ and $\Phi_{os2}$. In other words, $\Phi_1$, $\Phi_2$, $\Phi_3$, $\Phi_{swp}$, $\Phi_{swn}$ and $\Phi_{os}$ may be considered as waveforms of control signals for the corresponding switches. In this embodiment, the switch status (or waveform) "High" refers to turned-on and "Low" refers to turned-off.

As shown in FIG. 7, in each sensing period of the AFE circuit 60, there are an offset sensing phase and a signal coupling phase following the offset sensing phase. The reference voltage $V_{ref\_Tx}$ of the pixel cell toggles (i.e., transits from "High" to "Low") in each of the offset sensing phase and the signal coupling phase. In the offset sensing phase, the input switch group 600 may be turned on and connected as the swapping configuration, where the input switch group 600 couples the input capacitor $C_{S1}$ (and the compensation capacitor $C_{comp1}$) to the floating node y and couples the input capacitor $C_{S2}$ (and the compensation capacitor $C_{comp2}$) to the floating node x. At this moment, the storage control switches $\Phi_{os1}$ and $\Phi_{os2}$ are turned on, allowing first offset information of the input capacitors $C_{S1}$ and $C_{S2}$ and second offset information of the compensation capacitors $C_{comp1}$ and $C_{comp2}$ to be inversely coupled to the storage capacitors $C_{F2}$ and $C_{F1}$ via the floating nodes y and x and the storage control switches $\Phi_{os2}$ and $\Phi_{os1}$; hence, at the end of the offset sensing phase, the first offset information and the second offset information may be stored in the storage capacitors $C_{F1}$ and $C_{F2}$ with the swapping configuration of the input switch group 600.

In the signal coupling phase, the input switch group 600 may be turned on and connected as the non-swapping configuration, where the input switch group 600 couples the input capacitor $C_{S1}$ (and the compensation capacitor $C_{comp1}$) to the floating node x and couples the input capacitor $C_{S2}$ (and the compensation capacitor $C_{comp2}$) to the floating node y. When the reference voltage $V_{ref\_TX}$ of the pixel cell toggles in the signal coupling phase, the storage control switches $\Phi_{os1}$ and $\Phi_{os2}$ are turned on again, allowing third offset information of the input capacitors $C_{S1}$ and $C_{S2}$ and fourth offset information of the compensation capacitors $C_{comp1}$ and $C_{comp2}$ to be straightly coupled to the storage capacitors $C_{F1}$ and $C_{F2}$ via the floating nodes x and y and the storage control switches $\Phi_{os1}$ and $\Phi_{os2}$. The third offset information and the fourth offset information may thereby cancel the first offset information and the second offset information previously stored in the storage capacitors $C_{F1}$ and $C_{F2}$ in the offset sensing phase; hence, the offset information may be canceled and may not appear in the output signal of the AFE circuit 60.

Please note that the above offset information may be generated from the difference or mismatch on capacitance values of the input capacitors $C_{S1}$ and $C_{S2}$ and/or the compensation capacitors $C_{comp1}$ and $C_{comp2}$. This offset information may be coupled to the floating nodes x and y via the input switch group 600, and then coupled to and stored in the storage capacitors $C_{F1}$ and $C_{F2}$ in the form of charges or voltage/current difference. Since the input switch group 600 may be switched between the swapping configuration and the non-swapping configuration, the offset information coupled to the storage capacitors $C_{F1}$ and $C_{F2}$ when the input switch group 600 is in the swapping configuration may be canceled by the offset information coupled to the storage capacitors $C_{F1}$ and $C_{F2}$ when the input switch group 600 is in the non-swapping configuration.

Please keep referring to FIG. 7 together with the circuit structures shown in FIG. 1 and FIG. 6. In the offset sensing phase, the reset switch $RST_{pix}$ is continuously turned on, i.e., the pixel cell keeps in the reset status. Therefore, when the reference voltage $V_{ref\_TX}$ of the pixel cell toggles, the sensing signal $V_{pix}$ outputted by the pixel cell transits its level from $V_{ref}+\Delta V_{CM}$ to $V_{ref}$ as similar to the transition of the dummy signal $V_{pix\_dmy}$. In such a situation, both of the differential input nodes of the AFE circuit 60 receive the reference voltage $V_{ref}$ and no DM part signal is included in the sensing signal $V_{pix}$ in the offset sensing phase. The DM part signal corresponding to the finger capacitance $C_f$ may be carried out in the signal coupling phase. As shown in FIG. 7, the reset switch $RST_{pix}$ is turned off before the reference voltage $V_{ref\_TX}$ toggles in the signal coupling phase. Therefore, when the reference voltage $V_{ref\_TX}$ toggles, the sensing signal $V_{pix}$ outputted by the pixel cell transits its level from $V_{ref}+\Delta V_{CM}$ to $V_{ref}-\Delta V_{DM}$; that is, the received sensing signal $V_{pix}$ includes the CM part signal corresponding to the transmitting signal TX plus the DM part signal including information of the finger capacitance $C_f$. At this moment, the dummy input node still receives the reference signal as the dummy signal $V_{pix\_dmy}$ which transits from $V_{ref}+\Delta V_{CM}$ to $V_{ref}$.

Preferably, at the transition time between the offset sensing phase and the signal coupling phase, the storage control switches $\Phi_{os1}$ and $\Phi_{os2}$ may be turned off when the input switch group 600 is switched from the swapping phase to the non-swapping phase, as shown in FIG. 7. This prevents the charges stored in the storage capacitors $C_{F1}$ and $C_{F2}$ from being influenced by switching of the input switch group 600.

Similar to the operations of the AFE circuit 40 as shown in FIG. 5, in FIG. 7, the compensation signal $V_{comp}$ of the AFE circuit 60 transits in a manner inverse to the sensing signal $V_{pix}$ and the dummy signal $V_{pix\_dmy}$, to cancel the CM part variation and prevent the large CM part variation from being coupled to the input terminals of the amplifier 400. During the transitions of the sensing signal $V_{pix}$, the dummy signal $V_{pix\_dmy}$ and the compensation signal $V_{comp}$, the input switch group 600 is turned off, i.e., all of the input switches $\Phi_{swn1}$, $\Phi_{swn2}$, $\Phi_{swp1}$ and $\Phi_{swp2}$ are turned off, so as to prevent the signal transitions from being coupled to the floating nodes x and y, allowing the input terminals of the amplifier 400 to be maintained at a constant value. In addition, in the offset sensing phase, the storage control switches $\Phi_{2\_1}$, $\Phi_{2\_2}$, $\Phi_{3\_1}$ and $\Phi_{3\_2}$ toggle to control the storage capacitors $C_{F1}$ and $C_{F2}$ to be coupled to the reference node (receiving the CM voltage $V_{com}$) and then coupled to the output terminals of the amplifier 400. This operation realizes the auto-zeroing offset cancelation to cancel the input offset of the differential amplifier 400.

After the operations in the offset sensing phase and the signal coupling phase are accomplished, the output signal of the AFE circuit 60 may be obtained. The remaining time in the signal coupling phase shown in FIG. 7 refers to the operation time of the follow-up circuit such as the ADC. In comparison with the embodiment shown in FIG. 5, the embodiment shown in FIG. 7 includes an additional offset sensing phase. The increased time length for the offset sensing phase is far smaller than the total time length of the sensing period, and thus will not influence the user experience on fingerprint sensing. After the end of this sensing period, the next sensing period may start and similar operations may be repeated.

In order to clearly show how to cancel the influence of the mismatch between the compensation capacitors $C_{comp1}$ and $C_{comp2}$ and/or the input capacitors $C_{S1}$ and $C_{S2}$, the formulas related to the AFE circuit 60 are derived as follows. In the offset sensing phase, considering the total charges and charge conservation on the floating node y, an equation may be obtained as follows:

$$(V_{com} + V_{os} - V_{ref} - \Delta V_{CM})C_{S1} + (V_{com} + V_{os})C_{comp1} + \quad (2)$$
$$(V_{com} + V_{os} - V_{com})C_{F2} = (V'_{com} + V_{os} - V_{ref})C_{S1} +$$
$$(V'_{com} + V_{os} - \Delta V_{CM})C_{comp1} + \left(V'_{com} + V_{os} - V_{com} - \frac{\Delta vo}{2}\right)C_{F2}.$$

In the offset sensing phase, considering the total charges and charge conservation on the floating node x, another equation may be obtained as follows:

$$(V_{com} - V_{ref} - \Delta V_{CM})C_{S2} + (V_{com})C_{comp2} + (V_{com} - V_{com})C_{F1} = \quad (3)$$
$$(V'_{com} - V_{ref})C_{S2} + (V'_{com} - \Delta V_{CM})C_{comp2} + \left(V'_{com} - V_{com} + \frac{\Delta vo}{2}\right)C_{F1}.$$

wherein $V_{com}$ is the input CM voltage of the amplifier 400, $V_{os}$ is the input offset voltage of the amplifier 400, and $V_{com}'$ is the input CM voltage of the amplifier 400 after the variations of the sensing signal $V_{pix}$ and the dummy signal $V_{pix\_dmy}$ are coupled to the input terminals of the amplifier 400. In this phase, the output signal of the AFE circuit 60 is $\Delta vo$, where $$V_{outp} = V_{com} + \frac{\Delta vo}{2};$$
$$V_{outn} = V_{com} - \frac{\Delta vo}{2}.$$

Equations (2) and (3) correspond to the operations in the offset sensing phase. The formulas before equal sign represent the total charges on the floating nodes x and y when the sensing signal $V_{pix}$ is at its high level $V_{ref}+\Delta V_{CM}$ (before the signal toggles), and the formulas after equal sign represent the total charges on the floating nodes x and y when the sensing signal $V_{pix}$ is at its low level $V_{ref}$ (after the signal toggles). Due to charge conservation, the total charges on each of the floating nodes x and y before and after the signal toggles should be equal, which infers Equations (2) and (3).

Similarly, in the signal coupling phase, considering the total charges and charge conservation on the floating node y, an equation may be obtained as follows:

$$\left(V'_{com} + V_{os} - V_{com} - \frac{\Delta vo}{2}\right)C_{F2} + (V_{com} + V_{os} - V_{ref} - \Delta V_{CM})C_{S2} + \quad (4)$$
$$(V_{com} + V_{os})C_{comp2} = (V''_{com} + V_{os} - V_{ref})C_{S2} +$$
$$(V''_{com} + V_{os} - \Delta V_{CM})C_{comp2} + \left(V''_{com} + V_{os} - V_{com} - \frac{\Delta vo'}{2}\right)C_{F2}.$$

In the signal coupling phase, considering the total charges and charge conservation on the floating node x, another equation may be obtained as follows:

$$\left(V'_{com} - V_{com} + \frac{\Delta vo}{2}\right)C_{F1} + (V_{com} - V_{ref} - \Delta V_{CM})C_{S1} + (V_{com})C_{comp1} = \quad (5)$$
$$(V''_{com} - V_{ref} + \Delta V_{DM})C_{S1} +$$
$$(V''_{com} - \Delta V_{CM})C_{comp1} + \left(V''_{com} - V_{com} + \frac{\Delta vo'}{2}\right)C_{F1}.$$

Wherein, $V_{com}''$ is the input CM voltage of the amplifier 400 after the variations of the sensing signal $V_{pix}$ and the dummy signal $V_{pix\_dmy}$ are coupled to the input terminals of the amplifier 400 in the signal coupling phase, where the DM part signal is included in the signal coupling phase such that $V_{com}''$ may be slightly different from $V_{com}'$. The definitions of other parameters are identical to those described in the above paragraphs. In this phase, the output signal of the AFE circuit 60 becomes $\Delta vo'$, where $$V_{outp} = V_{com} + \frac{\Delta vo'}{2};$$
$$V_{outn} = V_{com} - \frac{\Delta vo'}{2}.$$

Equations (4) and (5) correspond to the operations in the signal coupling phase. The formulas before equal sign represent the total charges on the floating nodes x and y when the sensing signal $V_{pix}$ is at its high level $V_{ref}+\Delta V_{CM}$ (before the signal toggles), and the formulas after equal sign represent the total charges on the floating nodes x and y when the sensing signal $V_{pix}$ is at its low level $V_{ref}-\Delta V_{DM}$ (after the signal toggles). Due to charge conservation, the total charges on each of the floating nodes x and y before and after the signal toggles should be equal, which infers Equations (4) and (5).

Please note that there may be parasitic capacitors on the floating nodes x and y. Due to switching of the input switch group 600 and the differential structure of the amplifier 400, the parasitic capacitors may be canceled and may not appear in the output signal $\Delta vo'$. In such a situation, the charge quantities corresponding to the parasitic capacitors are omitted in the equations for brevity.

As mentioned above, the level of $V_{com}'$ may be substantially equal to $V_{com}$. The level of $V_{com}''$ is also substantially equal to $V_{com}'$ and $V_{com}$ based on similar reasons. Taking $V_{com}''=V_{com}'=V_{com}$, Equations (2)-(5) may be combined to obtain:

$$\frac{-\Delta V_{DM} C_{S1} \times 2}{(C_{F1} + C_{F2})} = \Delta vo'.$$

As can be seen, the output signal $\Delta vo'$ only includes the signal component related to the DM part signal $\Delta V_{DM}$, and the offsets or mismatches of the input capacitors $C_{S1}$ and $C_{S2}$ and the compensation capacitors $C_{comp1}$ and $C_{comp2}$ do not appear in the output signal $\Delta vo'$, which means that the offsets of these capacitors are entirely canceled.

Please note that the present invention aims at providing a signal processing circuit such as the AFE circuit and a method of automatically cancel the offsets of input capacitors and compensation capacitors by swapping signal paths and using the storage capacitors. Those skilled in the art may make modifications and alternations accordingly. For example, in the above embodiment, the input switch group 600 is connected as the swapping configuration in the offset sensing phase and connected as the non-swapping configuration in the signal coupling phase. In another embodiment, the input switch group 600 may change to be connected as the non-swapping configuration in the offset sensing phase and connected as the swapping configuration in the signal coupling phase. This implementation may also be feasible for canceling the offsets of the capacitors. In addition, the detailed implementation of the input switch group 600 shown in FIG. 6 is one of various embodiments of the present invention. Those skilled in the art should understand that the input switch group 600 may be implemented in another manner such as using several multiplexers to swap the connections of signal paths. Furthermore, in the above embodiment, the signal processing circuit is applied to process the sensing signal received from a capacitive fingerprint sensor where the received sensing signal carries information of finger capacitance. Those skilled in the art should understand that the application of the present invention is not limited thereto. In fact, the offset cancelation scheme of the present invention is applicable to any processing circuit with the differential structure that is required to deal with a pumping voltage and/or cancel a large CM voltage variation.

Figure 8:
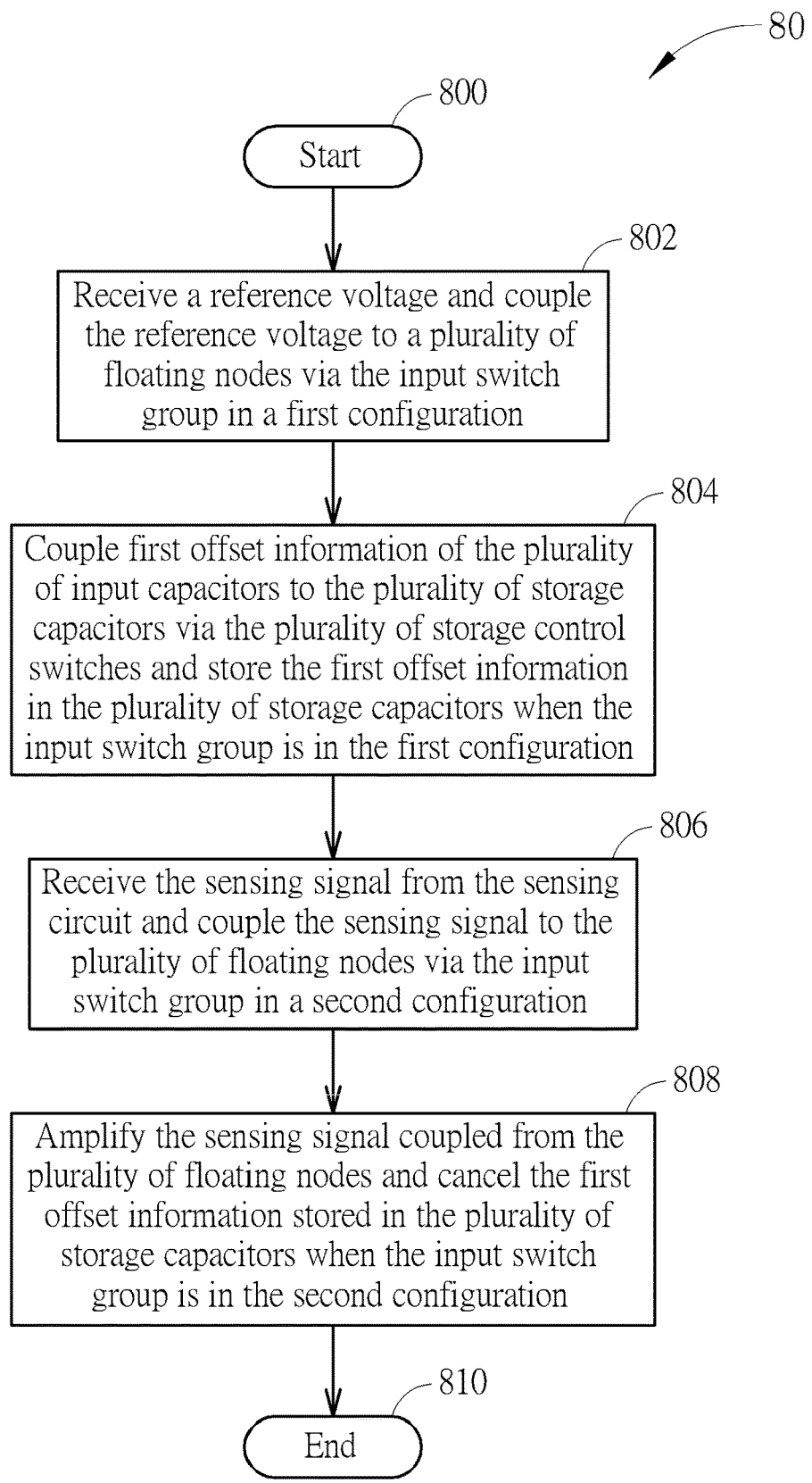
FIG. 8 is a flowchart of a signal processing process according to an embodiment of the present invention.

The abovementioned operations of the AFE circuit and the related method of automatically canceling the offsets of input capacitors and compensation capacitors may be summarized into a signal processing process 80, as shown in FIG. 8. The signal processing process 80, which may be implemented in a signal processing circuit such as the AFE circuit 60 shown in FIG. 6, includes the following steps:

Step 800: Start.

Step 802: Receive a reference voltage and couple the reference voltage to a plurality of floating nodes via the input switch group in a first configuration.

Step 804: Couple first offset information of the plurality of input capacitors to the plurality of storage capacitors via the plurality of storage control switches and store the first offset information in the plurality of storage capacitors when the input switch group is in the first configuration.

Step 806: Receive the sensing signal from the sensing circuit and couple the sensing signal to the plurality of floating nodes via the input switch group in a second configuration.

Step 808: Amplify the sensing signal coupled from the plurality of floating nodes and cancel the first offset information stored in the plurality of storage capacitors when the input switch group is in the second configuration.

Step 810: End.

The detailed implementations and alternations of the signal processing process 80 are illustrated in the above paragraphs and will not be narrated herein.

To sum up, the embodiments of the present invention provide a signal processing circuit and a related method of processing a sensing signal, which are capable of canceling the offset generated from the capacitors in the signal processing circuit by swapping the switch configuration and storing the offset information. The signal processing circuit may include an input switch group coupled between the input capacitors and the compensation capacitors and the floating nodes, and also include a pair of storage control switches coupled between the floating nodes and the storage capacitors. In an offset sensing phase, the offset information of the input capacitors and/or the compensation capacitors may be inversely coupled to the floating nodes and then coupled to the storage capacitors when the input switch group is in a first configuration. Ina signal coupling phase following the offset sensing phase, the offset information of the input capacitors and/or the compensation capacitors may be straightly coupled to the floating nodes and then coupled to the storage capacitors when the input switch group is in a second configuration. Therefore, the offset information previously stored in the storage capacitors may be canceled in the signal coupling phase. Only the desired sensing signal appears in the output signal of the signal processing circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit, for processing a sensing signal from a fingerprint sensing circuit, the signal processing circuit comprising:
   an analog-to-digital converter (ADC); and
   an analog front-end (AFE) circuit, coupled to the ADC, the AFE circuit comprising:
   a plurality of input capacitors, configured to receive the sensing signal from one of a differential input nodes of the signal processing circuit and couple the sensing signal to a plurality of floating nodes;
   an amplifier, coupled to the plurality of floating nodes, configured to amplify the sensing signal coupled from the plurality of floating nodes to generate an output signal, and output the output signal to the ADC;
   an input switch group, coupled between the plurality of floating nodes and the plurality of input capacitors;
   a plurality of storage capacitors;
   a plurality of first storage control switches, coupled between the plurality of floating nodes and the plurality of storage capacitors, configured to couple offset information of the plurality of input capacitors to the plurality of storage capacitors; and
   a plurality of reset switches, coupled between the floating nodes and differential output terminals of the amplifier.

2. The signal processing circuit of claim 1, wherein the AFE circuit further comprises:
   a plurality of compensation capacitors, coupled to the input switch group, configured to receive a compensation signal.

3. The signal processing circuit of claim 2, wherein the plurality of first storage control switches are further configured to couple offset information of the plurality of compensation capacitors to the plurality of storage capacitors.

4. The signal processing circuit of claim 1, wherein each of the plurality of first storage control switches is coupled to a first terminal of one of the plurality of storage capacitors, and a second terminal of each of the plurality of storage capacitors is further coupled to:
   a second storage control switch, coupled between the second terminal of the plurality of storage capacitor and a reference node; and
   a third storage control switch, coupled between the second terminal of the plurality of storage capacitor and one of differential output terminals of the amplifier.

5. The signal processing circuit of claim 1, wherein the signal processing circuit is configured to operate in an offset sensing phase and a signal coupling phase following the offset sensing phase.

6. The signal processing circuit of claim 5, wherein the input switch group is in a first configuration in the offset sensing phase and in a second configuration in the signal coupling phase.

7. The signal processing circuit of claim 6, wherein in the first configuration, the input switch group couples a first input capacitor among the plurality of input capacitors to a first floating node among the plurality of floating nodes and couples a second input capacitor among the plurality of input capacitors to a second floating node among the plurality of floating nodes, and in the second configuration, the input switch group couples the first input capacitor to the second floating node and couples the second input capacitor to the first floating node.

8. The signal processing circuit of claim 5, wherein in the offset sensing phase, both of the differential input nodes receive a reference voltage, and in the signal coupling phase, one of the differential input nodes receive the reference voltage and another one of the differential input nodes receive the sensing signal from the fingerprint sensing circuit.

9. The signal processing circuit of claim 5, wherein in the offset sensing phase, the plurality of first storage control switches are turned on, to couple first offset information of the plurality of input capacitors and second offset information of a plurality of compensation capacitors to the plurality of storage capacitors, and store the first offset information and the second offset information in the plurality of storage capacitors.

10. The signal processing circuit of claim 9, wherein in the signal coupling phase, the plurality of first storage control switches are turned on, to couple third offset information of the plurality of input capacitors and fourth offset information of the plurality of compensation capacitors to the plurality of storage capacitors, wherein the third offset information is configured to cancel the first offset information previously stored in the plurality of storage capacitors, and the fourth offset information is configured to cancel the second offset information previously stored in the plurality of storage capacitors.

11. The signal processing circuit of claim 1, wherein the input switch group comprises:
a first input switch, coupled between a first input capacitor among the plurality of input capacitors and a first floating node among the plurality of floating nodes;
a second input switch, coupled between a second input capacitor among the plurality of input capacitors and a second floating node among the plurality of floating nodes;
a third input switch, coupled between the first input capacitor and the second floating node; and
a fourth input switch, coupled between the second input capacitor and the first floating node.

12. The signal processing circuit of claim 11, wherein in an offset sensing phase, the input switch group is in a first configuration wherein the first input switch and the second input switch are turned on and the third input switch and the fourth input switch are turned off, and in a signal coupling phase, the input switch group is in a second configuration wherein the third input switch and the fourth input switch are turned on and the first input switch and the second input switch are turned off.

13. A method of processing a sensing signal received from a sensing circuit for a signal processing circuit, the signal processing circuit comprising a plurality of input capacitors, an input switch group, a plurality of storage control switches, and a plurality of storage capacitors, the method comprising:
receiving a reference voltage and coupling the reference voltage to a plurality of floating nodes via the input switch group in a first configuration;
coupling first offset information of the plurality of input capacitors to the plurality of storage capacitors via the plurality of storage control switches and storing the first offset information in the plurality of storage capacitors when the input switch group is in the first configuration;
receiving the sensing signal from the sensing circuit and coupling the sensing signal to the plurality of floating nodes via the input switch group in a second configuration; and
amplifying the sensing signal coupled from the plurality of floating nodes and canceling the first offset information stored in the plurality of storage capacitors when the input switch group is in the second configuration.

14. The method of claim 13, wherein the step of canceling the first offset information stored in the plurality of storage capacitors when the input switch group is in the second configuration comprises:
coupling second offset information of the plurality of input capacitors to the plurality of storage capacitors via the plurality of storage control switches when the input switch group is in the second configuration, to cancel the first offset information previously stored in the plurality of storage capacitors.

15. The method of claim 13, wherein the signal processing circuit further comprises a plurality of compensation capacitors, and the method further comprises:
coupling third offset information of the plurality of compensation capacitors to the plurality of storage capacitors via the plurality of storage control switches and storing the third offset information in the plurality of storage capacitors when the input switch group is in the first configuration; and
coupling fourth offset information of the plurality of compensation capacitors to the plurality of storage capacitors via the plurality of storage control switches when the input switch group is in the second configuration, to cancel the third offset information previously stored in the plurality of storage capacitors.

16. The method of claim 13, wherein in the first configuration, the input switch group couples a first input capacitor among the plurality of input capacitors to a first floating node among the plurality of floating nodes and couples a second input capacitor among the plurality of input capacitors to a second floating node among the plurality of floating nodes, and in the second configuration, the input switch group couples the first input capacitor to the second floating node and couples the second input capacitor to the first floating node.

17. The method of claim 13, wherein the input switch group comprises:
a first input switch, coupled between a first input capacitor among the plurality of input capacitors and a first floating node among the plurality of floating nodes;
a second input switch, coupled between a second input capacitor among the plurality of input capacitors and a second floating node among the plurality of floating nodes;
a third input switch, coupled between the first input capacitor and the second floating node; and a fourth input switch, coupled between the second input capacitor and the first floating node.

18. The method of claim 17, wherein in an offset sensing phase, the input switch group is in the first configuration wherein the first input switch and the second input switch are turned on and the third input switch and the fourth input switch are turned off, and in a signal coupling phase, the input switch group is in the second configuration wherein the third input switch and the fourth input switch are turned on and the first input switch and the second input switch are turned off.

* * * * *